United States Patent
Hazama et al.

(10) Patent No.: US 10,158,060 B2
(45) Date of Patent: Dec. 18, 2018

(54) THERMOELECTRIC ELEMENT AND THERMOELECTRIC GENERATION SYSTEM

(71) Applicant: KABUSHIKI KAISHA TOYOTA CHUO KENKYUSHO, Nagakute-shi, Aichi-ken (JP)

(72) Inventors: Hirofumi Hazama, Nagakute (JP); Akitoshi Suzumura, Nagakute (JP); Yumi Saiki, Nagakute (JP); Ryoji Asahi, Nagakute (JP); Masato Matsubara, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 0 days.

(21) Appl. No.: 15/383,297

(22) Filed: Dec. 19, 2016

(65) Prior Publication Data
US 2017/0207379 A1    Jul. 20, 2017

(30) Foreign Application Priority Data
Jan. 18, 2016  (JP) ................................ 2016-007403

(51) Int. Cl.
*F24S 10/70* (2018.01)
*F24S 20/20* (2018.01)
(Continued)

(52) U.S. Cl.
CPC .............. *H01L 35/32* (2013.01); *F24S 10/70* (2018.05); *F24S 20/20* (2018.05); *H01L 35/04* (2013.01); *H01L 35/30* (2013.01)

(58) Field of Classification Search
CPC ... H01L 35/30; H01L 35/32; F24J 2/24; F24S 10/70; F24S 20/20
See application file for complete search history.

(56) References Cited

U.S. PATENT DOCUMENTS

| 3,400,452 A  * | 9/1968 | Emley ..................... H01L 35/32 136/201 |
| 4,419,532 A  * | 12/1983 | Severns ..................... F24J 2/07 136/253 |
| 2012/0160290 A1* | 6/2012 | Chen .......................... F24J 2/32 136/206 |

FOREIGN PATENT DOCUMENTS

| CN | 102742032 A | 10/2012 |
| JP | 2002-106964 A | 4/2002 |

(Continued)

OTHER PUBLICATIONS

Daniel Kraemer et al., "High-performance flat-panel solar thermoelectric generators with high thermal concentration," Nature Materials, 2011, pp. 532-538, vol. 10, Macmillan Publishers Limited.
(Continued)

*Primary Examiner* — Lindsey A Bernier
(74) *Attorney, Agent, or Firm* — Oliff PLC

(57) ABSTRACT

A thermoelectric element includes a thermoelectric member made of thermoelectric materials and having a through hole, a pipe inserted into the through hole for making fluid flow, and a soaking member provided to the side of the thermoelectric element. The pipe and the soaking member respectively also function as an electrode of the thermoelectric member. A surface of the soaking member includes a blackened surface and a mirror surface. A thermoelectric generation system includes a container having a lighting window, the thermoelectric element housed in the container, a fluid feeder for feeding fluid into the pipe, and a power consumption source that consumes electric power generated by the thermoelectric element. The thermoelectric element is housed in the container so that the blackened surface is located under the lighting window.

9 Claims, 12 Drawing Sheets

(51) Int. Cl.
H01L 35/30 (2006.01)
H01L 35/32 (2006.01)
H01L 35/04 (2006.01)

(56) References Cited

FOREIGN PATENT DOCUMENTS

| JP | 2010-529395 A | 8/2010 |
|---|---|---|
| JP | 2010-190455 A | 9/2010 |
| JP | 2012-211753 A | 11/2012 |
| JP | 2012-222169 A | 11/2012 |
| JP | 2013-004753 A | 1/2013 |

OTHER PUBLICATIONS

Lauryn L. Baranowski et al., "Concentrated solar thermoelectric generators," Energy and Environmental Science, 2012, vol. 5, pp. 9055-9067.
Sep. 4, 2018 Office Action issued in Chinese Patent Application No. 201710035108.8.

* cited by examiner

[FIG. 1A]
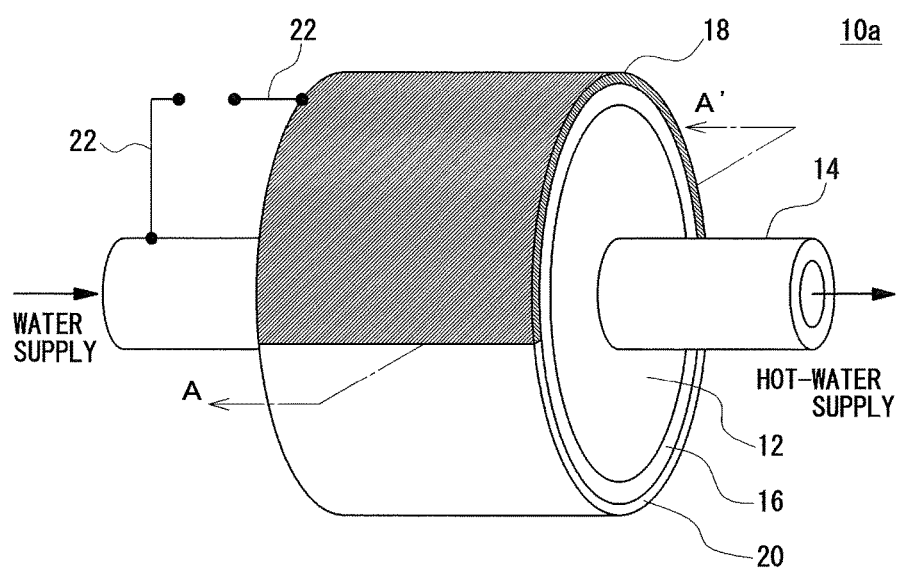
[FIG. 1B]
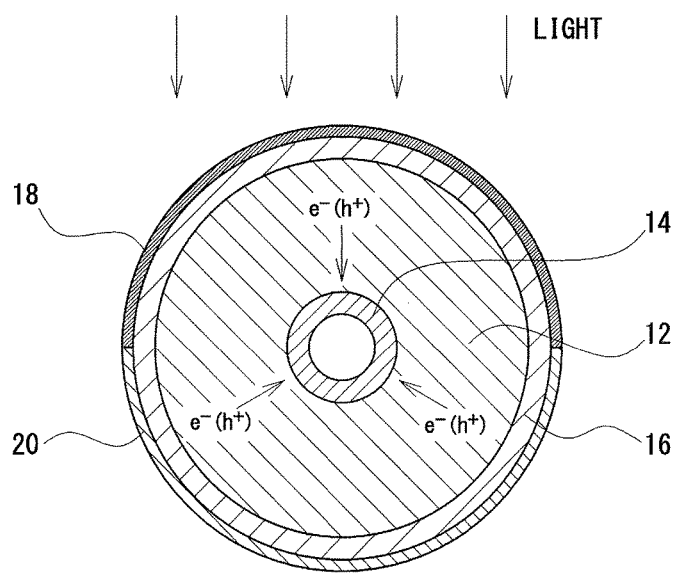

[FIG. 2A]
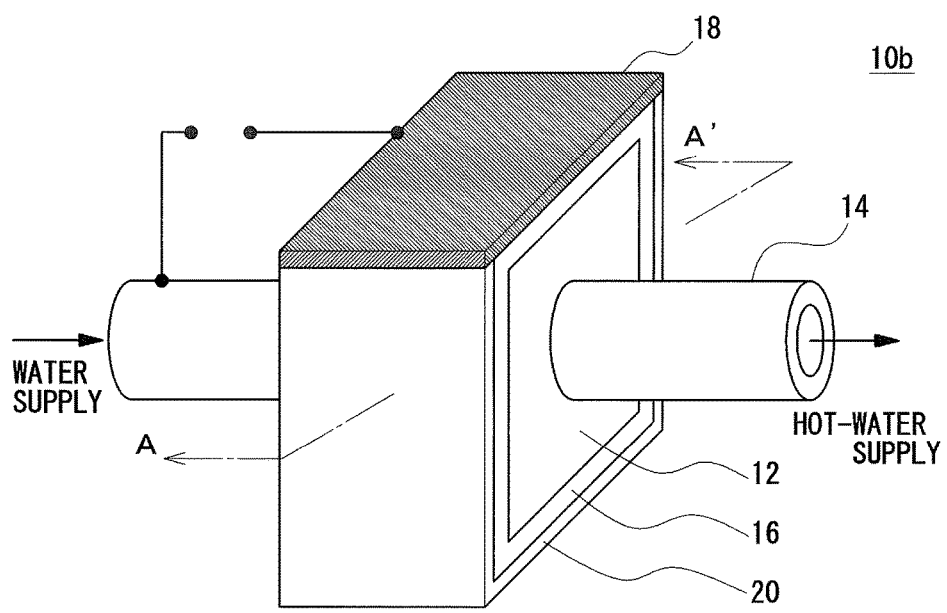
[FIG. 2B]
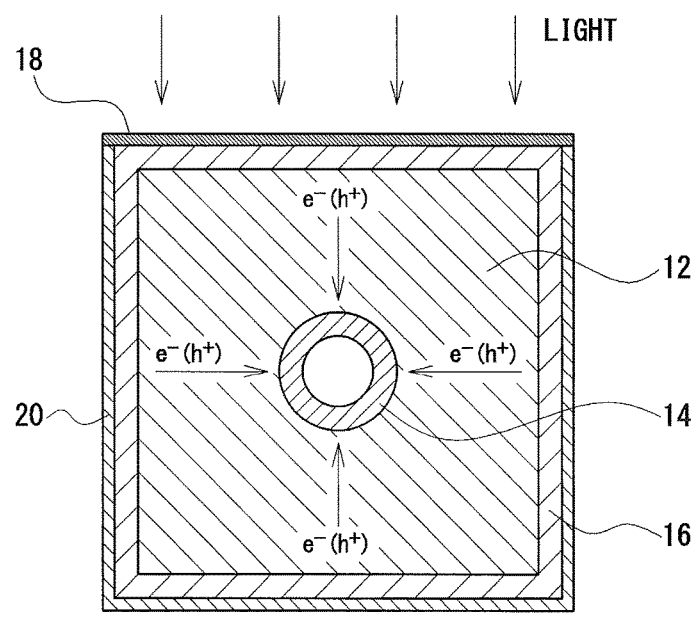

[FIG. 3A]
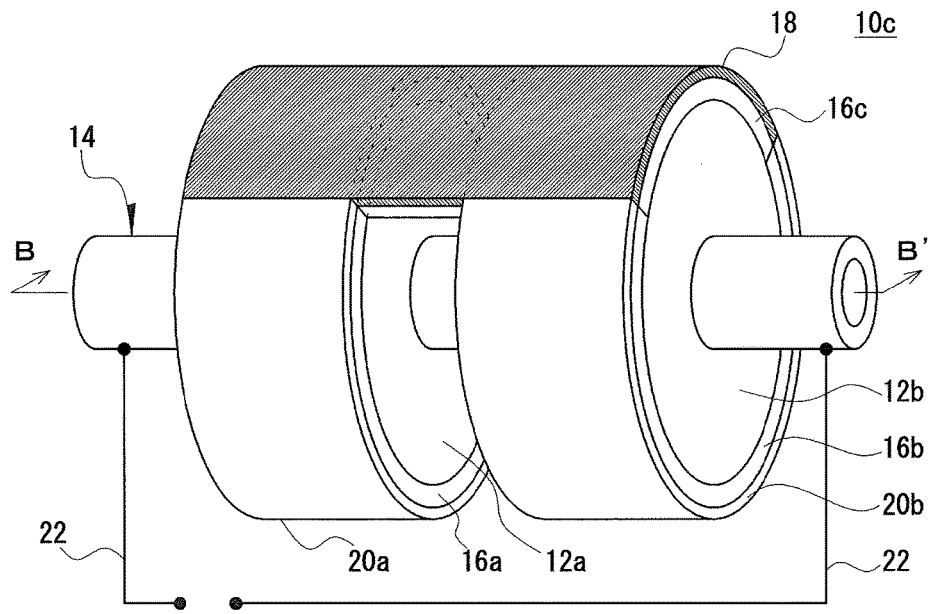
[FIG. 3B]
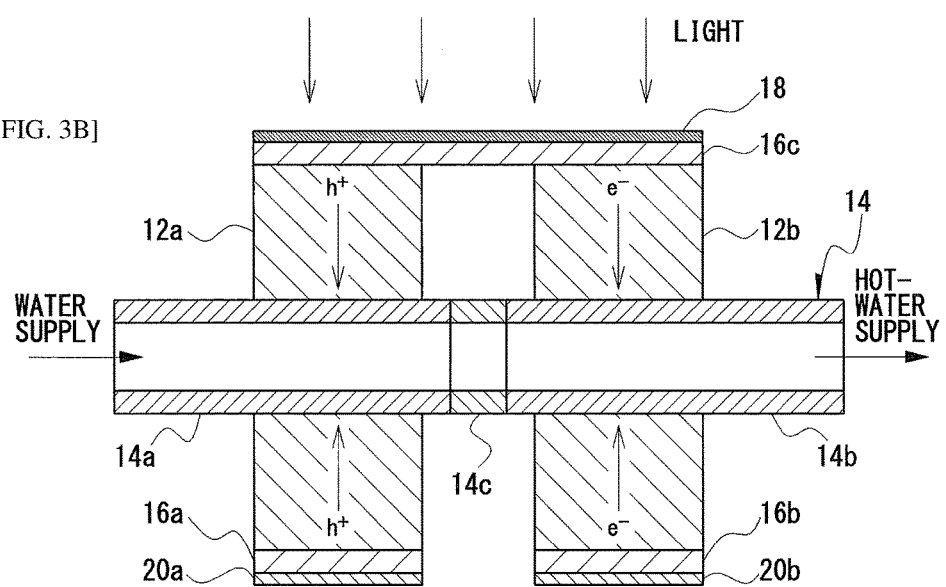

[FIG. 4A]
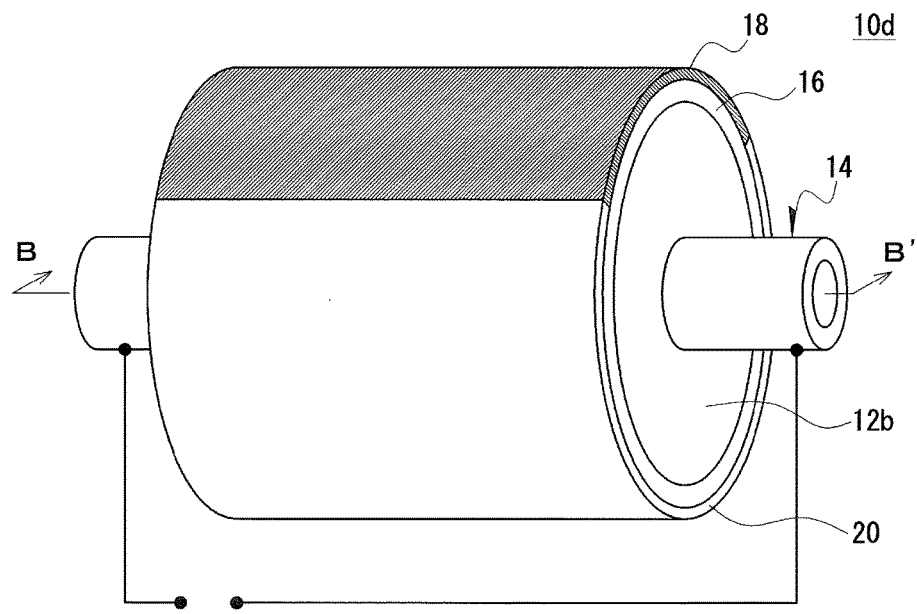
[FIG. 4B]
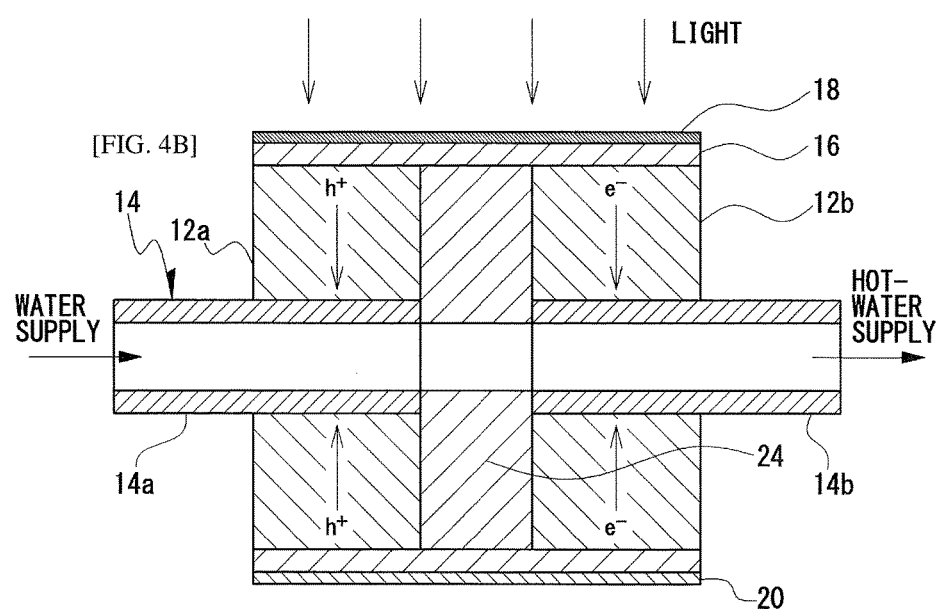

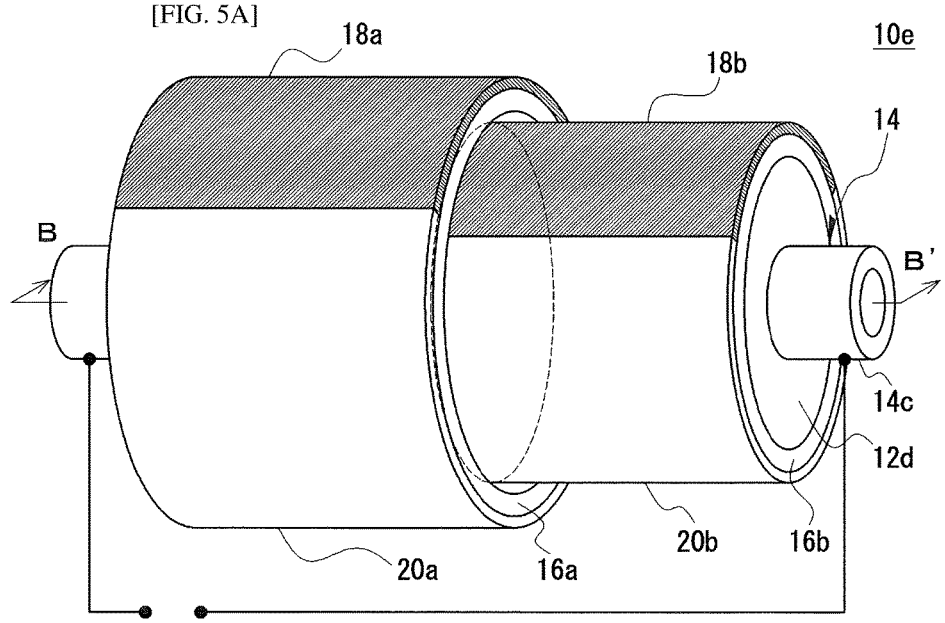
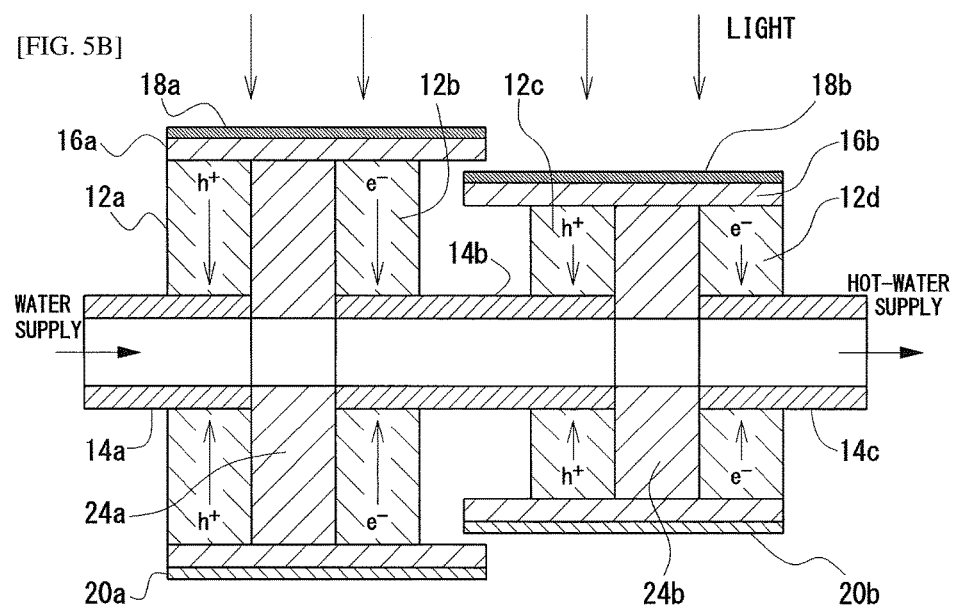

[FIG. 6A]
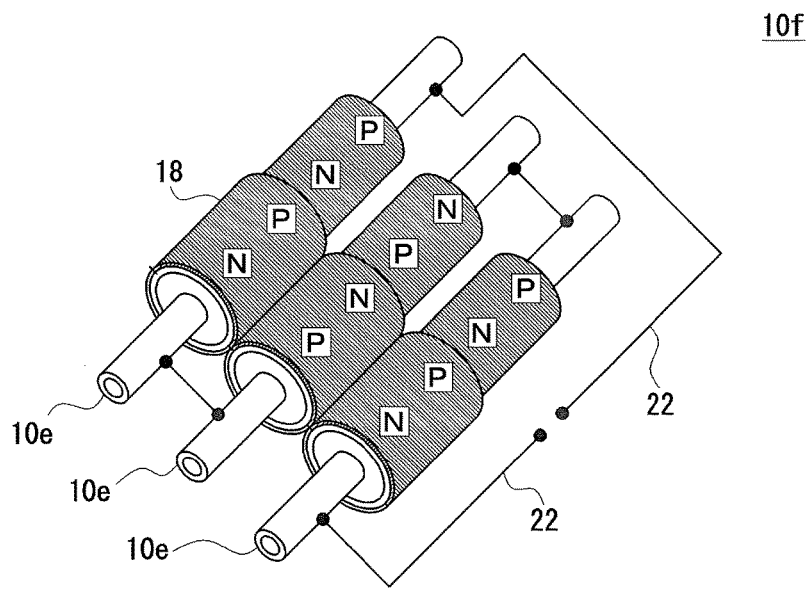
[FIG. 6B]
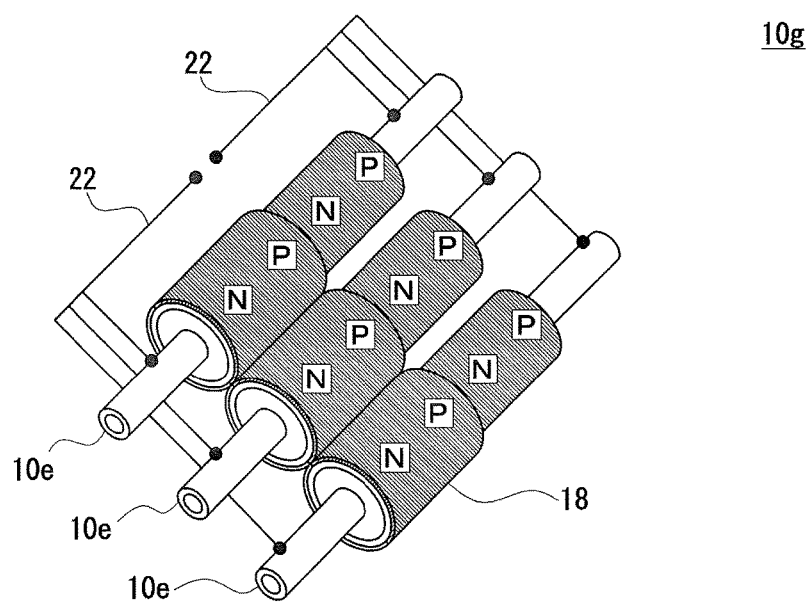

[FIG. 7A]
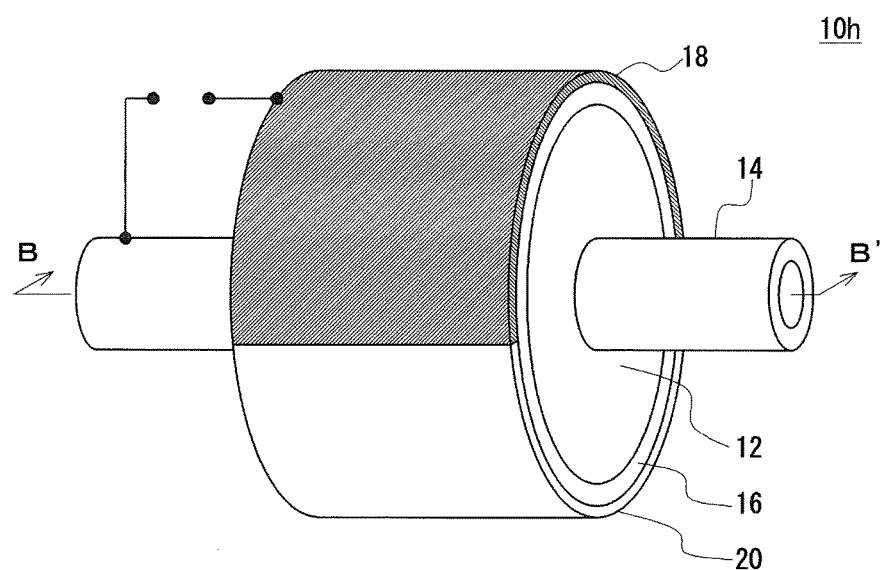
[FIG. 7B]
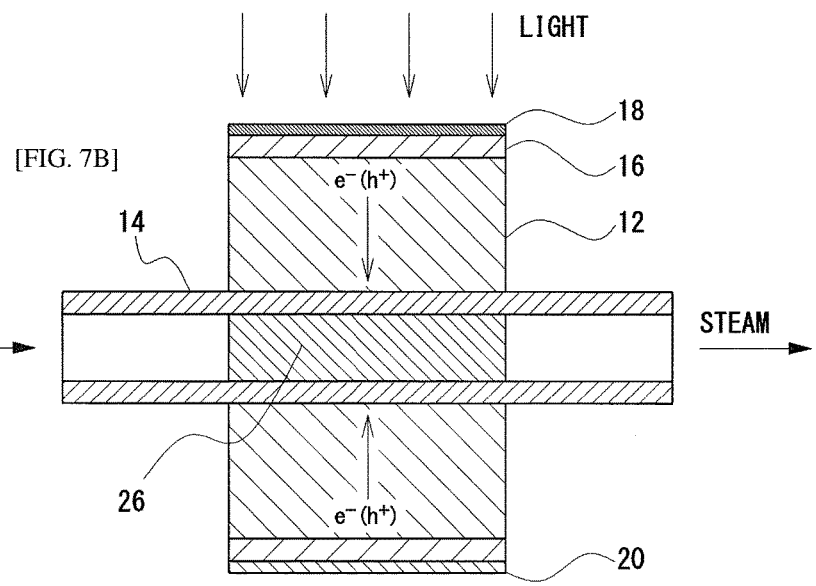

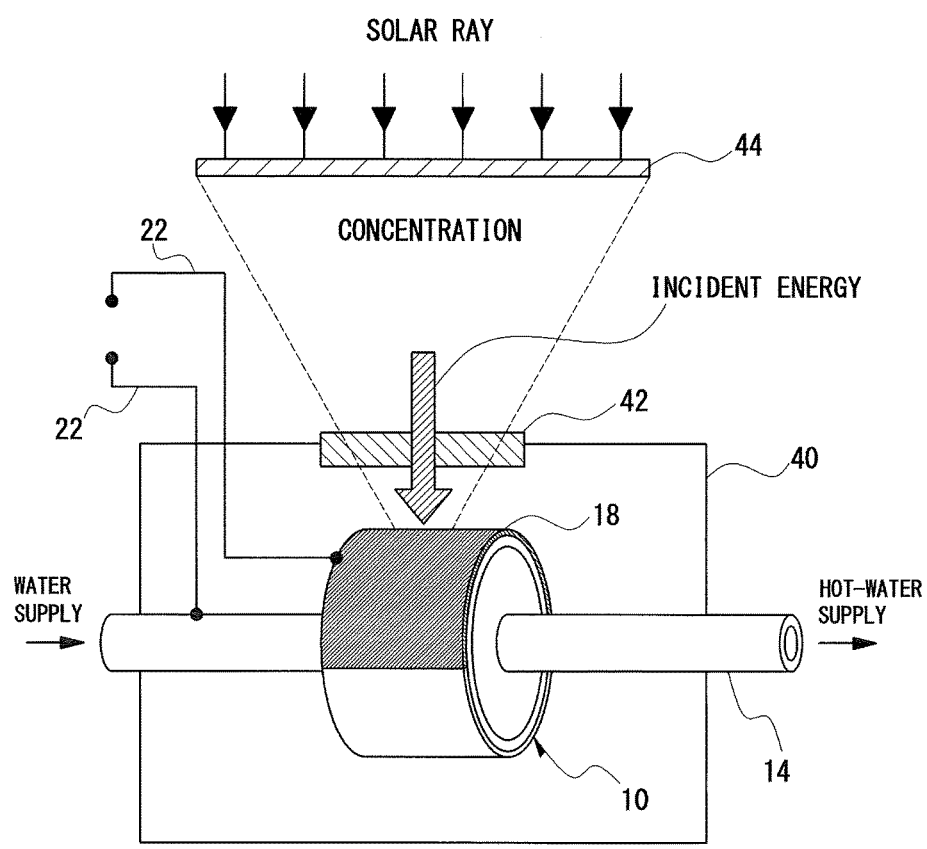
[FIG. 8]

[FIG. 9]
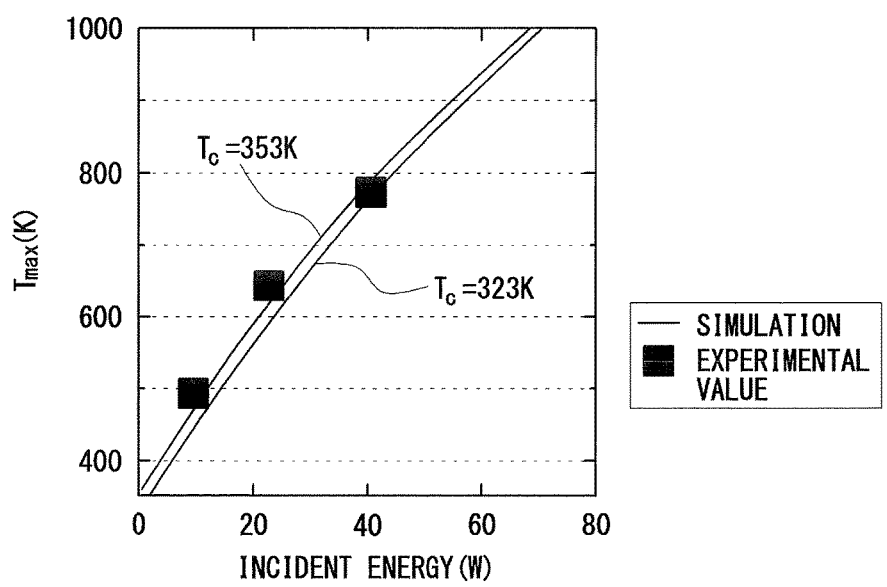

[FIG. 10]
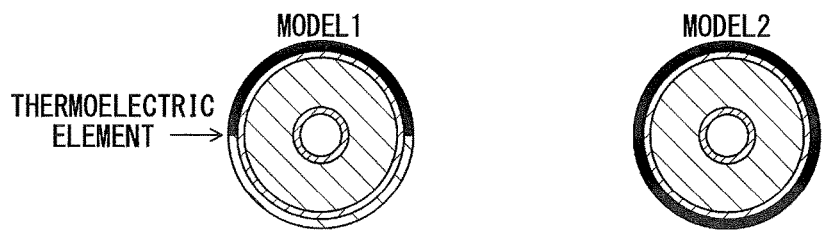
| MODEL | INCIDENT ENERGY $Q_{in}$ (W) | RADIATION LOSS $Q_R$ (W) | OUTER PERIPHERAL TEMPERATURE $T_{max}$ (K) | RADIATION LOSS RATE $Q_R/Q_{in}$ (%) |
|---|---|---|---|---|
| 1 | 8.6 | 0.4 | 480 | 4.7 |
| 1 | 19.4 | 1.3 | 635 | 6.7 |
| 1 | 34.1 | 3.7 | 826 | 10.9 |
| 2 | 8.6 | 0.8 | 474 | 9.3 |
| 2 | 19.4 | 2.3 | 618 | 11.9 |
| 2 | 34.1 | 6.2 | 788 | 18.2 |

[FIG. 11]
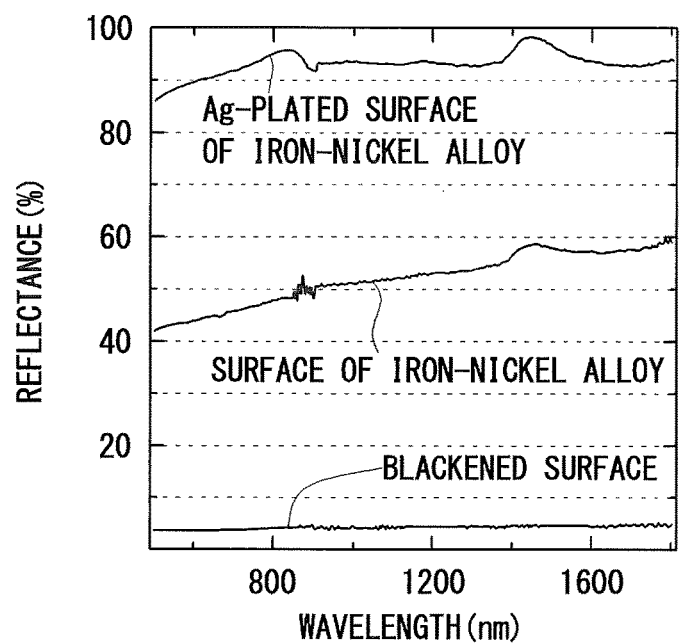

[FIG. 12]
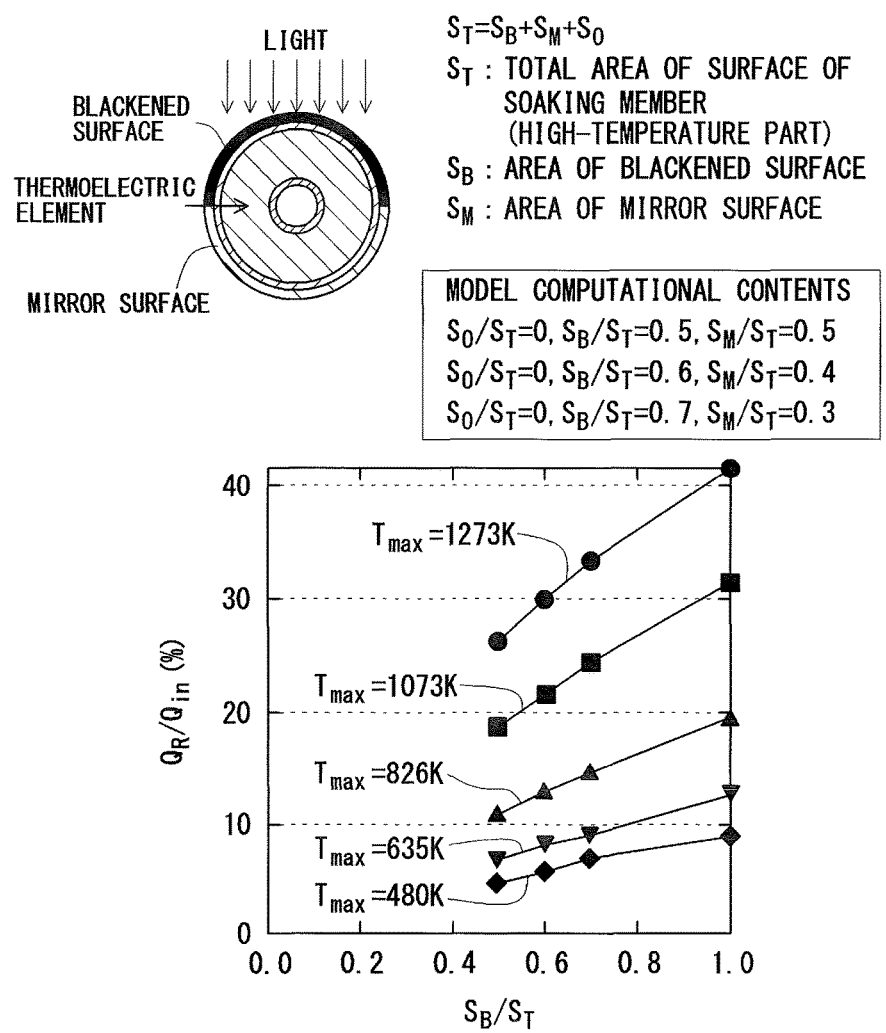

THERMOELECTRIC ELEMENT AND THERMOELECTRIC GENERATION SYSTEM

FIELD OF THE INVENTION

The present invention relates to a thermoelectric element and a thermoelectric generation system, more specifically, relates to a thermoelectric element that enables converting energy of light such as solar ray and far infrared ray to thermal energy and electrical energy, and a thermoelectric generation system using the thermoelectric element.

BACKGROUND OF THE INVENTION

A device that utilizes energy of solar ray is roughly divided into a device that directly converts solar ray to electrical energy and a device that converts solar ray to thermal energy. A solar cell is an example of the former. Examples of the latter include the followings:

(A) a solar heat utilization system that produces warm water and warm wind utilizing solar heat and utilizes this for hot-water supply and air conditioning; and (B) a thermoelectric generation system that generates temperature difference at both ends of a thermoelectric element utilizing solar heat and converts the temperature difference to electrical energy.

Of these, the solar cell can acquire only electric power and the solar cell cannot effectively utilize solar energy. A solar water heater has relatively high utilization efficiency of solar energy. However, since warm water is produced more than a required amount, the solar water heater cannot effectively utilize solar energy as a whole. In addition, the solar water heater can acquire no electric power. Further, solar thermal power generation using a steam turbine requires large-scale facilities.

In contrast, the thermoelectric generation system using the thermoelectric element has an advantage that the system can acquire both electric power and warm water and requires no large-scale facilities. Therefore, as for the thermoelectric generation system using the thermoelectric element, various proposals have been made.

For example, Non Patent Literature 1 discloses solar thermoelectric generators (STEGs) that convert solar ray to heat using a solar absorber put in a vacuum container and convert the heat to electric power by a thermoelectric element. The STEGs in the literature achieve thermoelectric conversion efficiency of 4.6%.

In the literature, thermoelectric power generation is performed using $Bi_2Te_3$ based thermoelectric materials. However, since the high-temperature side is approximately 200° C., no great temperature difference is produced in the thermoelectric element and the great enhancement of the thermoelectric conversion efficiency cannot be expected. Further, since heat unconverted to electricity is not utilized, the utilization efficiency of solar energy is low.

Non Patent Literature 2 discloses a calculation result of thermoelectric conversion efficiency of STEGs. The literature estimates that radiation of a high-temperature part can be inhibited by using a solar absorber composed of a long pass filter optimum for a wavelength of light and conversion efficiency of 15.9% at 1000° C. is acquired.

However, a long pass filter which has heat resistance and a cut-off wavelength of which is precisely controlled does not exist and the abovementioned estimate is not validated. Further, to acquire high thermoelectric conversion efficiency, temperature of the high-temperature part is required to be raised; however, a problem occurs that when the temperature of the high-temperature part is raised, heat loss by radiation increases.

Patent Literature 1 discloses a generator that heats the high-temperature side of a thermoelectric element using solar ray and cools the low-temperature side of the thermoelectric element using thermoelectric materials having Thomson effect.

The generator in the patent literature removes heat which is transmitted through the thermoelectric element without being converted into electric power by a system utilizing Thomson effect, and therefore utilization efficiency of solar energy is low.

Patent Literature 2 discloses power supply equipment where a thermoelectric element is arranged on an outer peripheral surface of a water pipe and solar ray irradiates the high-temperature side of the thermoelectric element using a crooked mirror surface body.

In the power supply equipment disclosed in the patent literature, when a degree of concentration of solar ray is low, the temperature of the high-temperature side of the thermoelectric element does not rise and thermoelectric conversion efficiency is low. In contrast, when the degree of concentration is high, heat loss due to convection in the high-temperature part cannot be prevented because the thermoelectric element is not put in a vacuum container. Further, the power supply equipment also does not have the function of preventing heat loss due to radiation.

Patent Literature 3 discloses a solar water heater where a solar heat collection face is provided to a circulating passage in which water in a warm water tank is circulated, warm water is produced from cool water using solar heat, the temperature difference between the cool water and the warm water is converted to electric power by using a thermoelectric element, and the warm water is forcedly circulated using the acquired electric power.

In the solar water heater disclosed in the patent literature, since all heat does not pass through the thermoelectric element, electric power is generated by only a small amount.

Patent Literature 4 discloses a hot-water supply system where solar ray is concentrated, electric power is generated by making infrared ray in the solar ray incident on a thermoelectric element by a wavelength selection mirror and making the remaining light incident on a solar cell and further, exhaust heat from the thermoelectric element and the solar cell is utilized for hot-water supply.

In the patent literature, no experimental results of the hot-water supply system are described. Further, in the hot-water supply system in the patent literature, temperature of the thermoelectric element does not rise and power generation efficiency of the thermoelectric element is low. Moreover, since temperature of exhaust heat from the solar cell and the thermoelectric element is low, efficiency of heat collection is unsatisfactory though a heat pump using carbon dioxide for coolant is used. Further, since the thermoelectric element and the solar cell are combined, structure of the system is intricate.

Patent Literature 5 discloses a thermoelectric cogeneration system that houses a heat storage material which can store solar heat as chemical energy in a reactor and converts heat generated in the reactor to electric power by the thermoelectric element.

As the thermoelectric cogeneration system disclosed in the patent literature performs heat storage and heat release using reversible reaction (for example, $Mg(OH)_2 \leftrightarrow MgO + H_2O$) of the heat storage material, the system has a merit that a high-temperature part of the thermoelectric element is kept constant and electric power can be stably supplied. However, energy loss is caused in a heat storage process and utilization efficiency of solar heat energy is low.

Further, Patent Literature 6 discloses a method of converting solar ray to heat using a light absorber, converting the heat to electric power by a thermoelectric element, further making fluid (for example, water) flow on the low-temperature side of the thermoelectric element and heating the fluid.

As disclosed in the abovementioned related art literatures, when the light absorber and the thermoelectric element are combined, utilization efficiency of solar energy can be enhanced to a certain extent. Further, when heat wasted from the low-temperature side of the thermoelectric element is recovered by various methods, the utilization efficiency of solar energy is further enhanced.

In contrast, to further enhance the utilization efficiency of solar energy, it is preferable that temperature of a high-temperature part of the thermoelectric element is raised to be higher. However, since heat loss by radiation increases as the temperature of the high-temperature part is higher according to the previous method, the enhancement of the utilization efficiency has had a limit.

CITATION LIST

Patent Literature

[Patent Literature 1] Japanese Unexamined Patent Application Publication No. 2013-004753
[Patent Literature 2] Japanese Unexamined Patent Application Publication No. 2012-222169
[Patent Literature 3] Japanese Unexamined Patent Application Publication No. 2002-106964
[Patent Literature 4] Japanese Unexamined Patent Application Publication No. 2010-190455
[Patent Literature 5] Japanese Unexamined Patent Application Publication No. 2012-211753
[Patent Literature 6] Japanese Unexamined Patent Application Publication (Translation of PCT Application) No. 2010-529395

Non Patent Literature

[Non Patent Literature 1] D. Kraemer et al., Nature Materials 10 532 (2011)
[Non Patent Literature 2] L. L. Baranowski et al., Energy Environmental Science 5 9055 (2012)

SUMMARY OF THE INVENTION

An object of the present invention is to provide a thermoelectric element that enables converting energy of light such as solar ray and far infrared ray to thermal energy and electrical energy, and a thermoelectric generation system using the thermoelectric element.

Further, another object of the present invention is to reduce exhaust heat loss and heat loss by radiation in the thermoelectric element and the thermoelectric generation system.

To achieve the abovementioned objects, the thermoelectric element according to the present invention is provided with the following configurations.

(1) The thermoelectric element includes:
a thermoelectric member made of thermoelectric materials and having a through hole pierced from one end face to another end face,
a pipe inserted into the through hole for making fluid flow, and
a soaking member provided to a side of the thermoelectric member.

(2) The pipe also functions as one electrode of the thermoelectric member, and
the soaking member also functions as another electrode of the thermoelectric member.

(3) A surface of the soaking member includes a blackened surface to which a blackening process is applied and a mirror surface to which mirror finish process is applied.

The thermoelectric generation system according to the present invention is provided with the following configurations.

(1) The thermoelectric generation system includes:
a container having a lighting window for taking light inside,
the thermoelectric element according to the present invention housed in the container,
a fluid feeder for feeding the fluid into the pipe, and
a power consumption source that consumes electric power generated by the thermoelectric element.

(2) The thermoelectric element is housed in the container so that the blackened surface is located under the lighting window.

When light such as solar ray and far infrared ray irradiates the blackened surface of the thermoelectric element, the light is absorbed by the blackened surface and is converted to thermal energy. This thermal energy is transferred from the blackened surface to the whole soaking member and substantially uniformly heats the whole side of the thermoelectric element. Consequently, a temperature difference (that is, electromotive force) occurs between the side of the thermoelectric element and an inner surface of the through hole.

Further, while the blackened surface has high absorption efficiency of light energy, heat loss by radiation is large. In contrast, while the mirror surface has low absorption efficiency of light energy, heat loss by radiation is small. Therefore, when the blackened surface is formed on a light receiving surface and the mirror surface is formed in the remaining part on the surface of the soaking member, heat loss by radiation can be restricted to the minimum.

Further, when fluid as a heat exchange medium is made to flow in the pipe inserted in the substantial center of the thermoelectric element or the pipe is filled with a chemical heat storage material, exhaust heat from the low-temperature side of the thermoelectric element can be recovered.

BRIEF DESCRIPTION OF THE DRAWINGS

FIG. 1A is a perspective view showing a thermoelectric element according to a first embodiment of the present invention and FIG. 1B is a sectional view viewed along a line A-A' in FIG. 1A;

FIG. 2A is a perspective view showing the thermoelectric element according to a second embodiment of the present invention and FIG. 2B is a sectional view viewed along a line A-A' in FIG. 2A; and FIG. 3A is a perspective view showing a thermoelectric element according to a third embodiment of the present invention and FIG. 3B is a sectional view viewed along a line B-B' in FIG. 3A.

FIG. 4A is a perspective view showing a thermoelectric element according to a fourth embodiment of the present invention and FIG. 4B is a sectional view viewed along a line B-B' in FIG. 4A;

FIG. 5A is a perspective view showing a thermoelectric element according to a fifth embodiment of the present invention and FIG. 5B is a sectional view viewed along a line B-B' in FIG. 5A;

FIGS. 6A and 6B are perspective views showing thermoelectric elements according to a sixth embodiment of the preset invention; and FIG. 7A is a perspective view showing a thermoelectric element according to a seventh embodiment of the present invention and FIG. 7B is a sectional view viewed along a line B-B' in FIG. 7A.

FIG. 8 is a schematic diagram showing a thermoelectric generation system according to one embodiment of the present invention;

FIG. 9 shows relation between incident energy and temperature $T_{max}$ of a high-temperature part;

FIG. 10 shows radiation loss to incident energy, the temperature $T_{max}$ of the high-temperature part and a radiation loss rate (where $T_c$=353 K);

FIG. 11 shows dependency upon a wavelength of reflectance of each surface; and FIG. 12 shows dependency upon blackening process ratio $S_B/S_T$ of a radiation loss rate $Q_R/Q_{in}$ (where $T_c$=353 K).

DETAILED DESCRIPTION OF THE PREFERRED EMBODIMENTS

One embodiment of the present invention will be described in detail below.

1. Thermoelectric Element

A thermoelectric element according to the present invention is provided with the following configurations.

(1) The thermoelectric element includes:

a thermoelectric member made of thermoelectric materials and having a through hole pierced from one end face to another end face, a pipe inserted into the through hole for making fluid flow, and a soaking member provided to a side of the thermoelectric element.

(2) The pipe also functions as one electrode of the thermoelectric member, and the soaking member also functions as another electrode of the thermoelectric member.

(3) A surface of the soaking member includes a blackened surface to which a blackening process is applied and a mirror surface to which mirror finish process is applied.

1.1. Thermoelectric Member

[1.1.1. Thermoelectric Material]

The thermoelectric member is made of thermoelectric materials. In the present invention, types of the thermoelectric materials are not especially limited and various materials can be used according to objects. The thermoelectric materials may also be p-type thermoelectric materials or may also be n-type thermoelectric materials. Further, plural thermoelectric members can also be mounted on/over one pipe. In this case, the plural thermoelectric members may also be all either of p-type thermoelectric materials or n-type thermoelectric materials, or may also be both.

For the p-type thermoelectric materials, for example, $Bi_2Te_3$ based materials, PbTe based materials, $Zn_4Sb_3$ based materials, $CoSb_3$ based materials, Si—Ge based materials, Mn—Si based materials and $NaCo_2O_4$ based material can be given.

For the n-type thermoelectric materials, for example, $Bi_2Te_3$ based materials, PbTe based materials, $Mg_2Si$ based materials, $CoSb_3$ based materials, Si—Ge based materials, TiNiSn based materials and $Ba_8Ga_{16}Ge_{30}$ based materials can be given.

When the thermoelectric member includes one or more p-type thermoelectric members made of p-type thermoelectric materials and one or more n-type thermoelectric members made of n-type thermoelectric materials, it is preferable that the p-type thermoelectric member and the n-type thermoelectric member are alternately mounted on/over the pipe and these are electrically connected in series.

When light irradiates the side of the thermoelectric member, the side (the outer peripheral surface) is turned a high-temperature part and an inner surface of the through hole is turned a low-temperature part. Therefore, when the p-type thermoelectric member and the n-type thermoelectric member are alternately mounted on/over the pipe, the high-temperature part and the low-temperature part are alternately connected so that these thermoelectric members are connected in series.

[1.1.2. Shape]

A shape of the thermoelectric member is not especially limited and various shapes can be used according to objects. Examples of the shape of the thermoelectric member include the followings:

(a) a cylindrical shape in which a through hole is formed in the center of a cylinder; and (b) a prismatic shape in which a through hole is formed in the center of a prism.

Especially, since the cylindrical shape is relatively simple in manufacture and can readily make temperature distribution uniform, it is suitable for a shape of the thermoelectric member.

[1.1.3. Through Hole]

The thermoelectric member is provided with the through hole pierced from one end face to the other end face. For the through hole, one through hole may also be provided or two or more through holes may also be provided.

It is preferable that the through hole is formed in a position in which distance from the side (the outer peripheral surface) is as long as possible and distance from the side is as uniform as possible.

For example, when an outline of a section in an axial direction of the thermoelectric member (a section perpendicular to a direction in which the through hole is provided) is circular and the number of through holes is one, it is preferable that the through hole is formed so that the center of the circle and the center of the through hole coincide.

Or when a section in the axial direction of the thermoelectric member is rectangular and the number of through holes is two or more, it is preferable that the through holes are arranged in parallel with the longer side so that the shortest distance from a longer side and/or a shorter side to each through hole is substantially uniform.

1.2. Pipe

[1.2.1. Fluid]

The pipe is inserted into the through hole of the thermoelectric member. The pipe is provided so as to make fluid flow inside it. Examples of the fluid include the followings:

(a) a heat exchange medium used for recovering exhaust heat from the low-temperature side (an inner surface of the through hole) of the thermoelectric member; and (b) a working medium for chemical heat storage materials when the pipe is filled with the chemical heat storage materials as described later.

Types of fluid are not especially limited and optimum one can be selected according to objects. Examples of the fluid include the followings:

(1) liquid such as water, oil, an organic solvent and fused salt; and (2) gas such as steam, hydrogen, carbon dioxide and ammonia.

[1.2.2. Material of Pipe]

The pipe transmits heat from the thermoelectric member to fluid (or a chemical heat storage material), and also functions as one electrode of the thermoelectric member. Therefore, for materials of the pipe, materials having properties that (a) are not corroded by liquid or dissolved by fluid, (b) have higher thermal conductivity than the thermoelectric member, (c) have higher electric conductivity than the thermoelectric member, and (d) have heat resistance to working temperature are preferable.

The materials of the pipe are not especially limited as long as the abovementioned conditions are met. For the materials of the pipe, for example, stainless steel, a copper alloy and an aluminum alloy can be given.

[1.2.3. Connection of Thermoelectric Member and Pipe]

To make the pipe function as an electrode, the thermoelectric member and the pipe are required to be electrically connected. Further, to reduce heat transfer loss between the thermoelectric member and fluid (or the chemical heat storage material), it is preferable that a thermoelectric member and the pipe are thermally connected.

A method of connecting the thermoelectric member with the pipe is not especially limited as long as the abovementioned conditions are met. Examples of a connecting method include the followings:

(a) a method of bonding the thermoelectric member and the pipe by soldering or brazing;

(b) a method of filling clearance between the thermoelectric member and the pipe with grease having high electric conductivity and high thermal conductivity; and (c) a method of thermocompressively bonding the thermoelectric member and the pipe.

[1.2.4. Chemical Heat Storage Material]

The pipe may also be filled with a chemical heat storage material. In this case, the "chemical heat storage material" means materials that generate heat when a working medium is bonded and absorb heat when the working medium is desorbed.

When solar ray irradiates the outer peripheral surface side of the thermoelectric element, a part of the solar heat is converted to electric energy and the residual heat is radiated from the inner surface of the through hole. At this time, when the pipe is filled with the chemical heat storage material to which the working medium is bonded, the chemical heat storage material is heated by exhaust heat from the thermoelectric member. Consequently, the working medium is desorbed from the chemical heat storage material. That is, exhaust heat from the thermoelectric member is stored in the chemical heat storage material as chemical energy.

In contrast, when the working medium is supplied into the pipe at night or cloudy weather, the working medium is bonded to the chemical heat storage material and heat is released. Consequently, a temperature difference is made between the inner surface side (the high-temperature part) of the thermoelectric member and the outer peripheral surface side (the low-temperature part). That is, chemical energy possessed by the chemical heat storage material can be converted to electrical energy.

In the present invention, types of the chemical heat storage material are not especially limited and optimum materials can be used according to objects. Examples of the chemical heat storage material include the followings:

(a) a chemical heat storage material (for example, MgO, CaO, $MgCl_2$, $CaCl_2$, $Na_2S$, $H_2SO_4$, SrO and BaO) using water, oil, an organic solvent, fused salt and the like for a working medium;

(b) a chemical heat storage material (for example, a hydrogen storage alloy) using hydrogen for a working medium;

(c) a chemical heat storage material (for example, MgO, CaO and $Li_4SiO_4$) using carbon dioxide for a working medium; and (d) a chemical heat storage material (for example, an ammonia complex such as $FeCl_2 \cdot NH_3$) using ammonia for a working medium.

1.3. Soaking Member

[1.3.1. Material]

The soaking member is provided to the side (a surface except end faces on which the through hole is formed) of the thermoelectric member. The soaking member is provided so as to uniformly heat the side of the thermoelectric member. Since the thermoelectric member normally has low thermal conductivity, only a light receiving surface is locally heated when light directly irradiates the surface of the thermoelectric member. In contrast, when the soaking member is provided to the side of the thermoelectric member and light irradiates the surface of the soaking member, heat absorbed on the light receiving surface is also transferred to the surfaces except the light receiving surface. Consequently, the side of the thermoelectric member can be uniformly heated.

In this case, the "light receiving surface" means a surface on which light energy of 0.01 $W/cm^2$ or more is incident.

The thickness of the soaking member may be set freely. However, when the soaking member is too thick, the surface area of the soaking member increases, and heat loss by radiation increases by the quantity. In the case of a cylinder, the thickness equivalent to or below a radius of the thermoelectric member is preferable and the thickness equal to or below $1/10$ of the radius of the thermoelectric member is more preferable.

Further, the soaking member uniformly heats the side of the thermoelectric member and simultaneously, also functions as the other electrode of the thermoelectric member. Therefore, for materials of the soaking member, materials having (a) higher thermal conductivity than that of the thermoelectric member, (b) higher electric conductivity than that of the thermoelectric member, and (c) heat resistance to working temperature are preferable.

The materials of the soaking member are not especially limited as long as the abovementioned conditions are met. For the materials of the soaking member, for example, stainless steel, a copper alloy, an aluminum alloy, a silver alloy, a nickel alloy, carbon materials and a gold alloy can be given.

The soaking member may also be provided to the whole side of the thermoelectric member or may also be provided to a part. However, when exposed area of the side of the thermoelectric member excessively increases, heat equalization of the side is deteriorated and the power generation efficiency is deteriorated. Accordingly, it is preferable that a rate (hereinafter called "a coverage factor") of the area of the soaking member to the area of the side of the thermoelectric member is 90% or more. The coverage factor is preferably 95% or more and is more preferably 99% or more.

[1.3.2. Connection of Thermoelectric Member and Soaking Member]

To make the soaking member function as an electrode, the thermoelectric member and the soaking member are required to be electrically connected. Further, to reduce heat transfer loss between the thermoelectric member and the soaking member, it is preferable that the thermoelectric member and the soaking member are thermally connected.

A method of connecting the thermoelectric member with the soaking member is not especially limited as long as the abovementioned conditions are met. Examples of the connecting method include the followings:

(a) a method of bonding the thermoelectric member and the soaking member by soldering or brazing;

(b) a method of filling clearance between the thermoelectric member and the soaking member with grease having high electric conductivity and high thermal conductivity; and (c) a method of thermocompressively bonding the thermoelectric member and the soaking member.

[1.3.3. Blackened Surface and Mirror Surface]

[A. Definition]

The surface of the soaking member includes a blackened surface to which a blackening process is applied and a mirror surface to which mirror finish process is applied. While the blackened surface has high absorption efficiency of light energy, it has great heat loss by radiation. In contrast, while the mirror surface has low absorption efficiency of light energy, it has small heat loss by radiation. Therefore, when the blackened surface is formed on the light receiving surface and the mirror surface is formed in the remaining part on the surface of the soaking member, heat loss by radiation can be restricted to the minimum.

In this case, the "blackened surface" means a surface that enables limiting reflectance of light having a wavelength of 500 to 1800 nm to 20% or less. As the reflectance is low, absorptivity of light is enhanced and energy loss by radiation is reduced. The reflectance is preferably 10% or less and is more preferably 5% or less.

Examples of the process (the blackening process) for acquiring such a blackened surface include the followings:

(1) a process for applying commercially available blackening paint to the surface;

(2) a process for developing black by an electrolytic color development method; and (3) a process for depositing various metals or a semiconductor absorbing film by vapor deposition or sputtering.

The "mirror surface" means a surface that enables the reflectance of light having a wavelength of 500 to 1800 nm to be 80% or more on the average of all wavelengths. As the reflectance is higher, energy loss by radiation is reduced. The reflectance is preferably 90% or more.

Examples of the process (the mirror finish process) for acquiring such a mirror surface include the followings:

(1) a plating process;

(2) forming a metal film made of Ag, Al, Au and the like by sputtering or vapor deposition; and (3) metallic luster finish by buffing.

[B. Blackening Process Ratio]

The blackened surface is formed on the light receiving surface of the soaking member. The size and a shape of the light receiving surface are different depending upon a contour of the thermoelectric member, whether light is concentrated or not, a light irradiation direction and the like. It is preferable that the blackened surface is ideally coincident with the light receiving surface. However, the surfaces may also be slightly off. However, when a gap between the blackened surface and the light receiving surface excessively increases, energy loss increases.

Further, it is preferable that the surface of the soaking member is configured by only the blackened surface and the mirror surface. However, a surface (hereinafter called "the other surface") except the blackened surface and the mirror surface may also be included. However, when the area of the other surface excessively increases, energy loss increases.

To reduce energy loss, it is preferable that the soaking member meets relation of the following formulas (1) to (3).

$$S_T = S_B + S_M + S_O \qquad (1)$$

$$0 < S_B/S_T \leq 0.6 \qquad (2)$$

$$0 \leq S_O/S_T \leq 0.1 \qquad (3)$$

where $S_T$ denotes total area of the surface of the soaking member, $S_B$ denotes the area of the blackened surface, $S_M$ denotes the area of the mirror surface, and $S_O$ denotes area of a surface except the blackened surface and the mirror surface within the surface of the soaking member.

The formula (1) expresses that the surface of the soaking member is configured by the blackened surface, the mirror surface and the other surface.

"$S_B/S_T$" in the formula (2) denotes a rate (blackening process ratio) of the area of the blackened surface to the total area of the surface of the soaking member. Further, the formula (2) expresses tolerance of $S_B/S_T$.

When light is concentrated, the area of the light receiving surface can be minimized. Accordingly, it is preferable that $S_B/S_T$ is over zero.

In contrast, when the coverage factor is 100% and parallel rays irradiate the soaking member, the area of the light receiving surface is 50% of $S_T$ at most. That is, a maximum value of $S_B/S_T$ is theoretically 0.5, but $S_B/S_T$ may also be larger than 0.5. However, when $S_B/S_T$ is excessively large, energy loss increases. Accordingly, it is preferable that $S_B/S_T$ is equal to or below 0.6.

"$S_O/S_T$" in the formula (3) denotes a rate of the area of the other surface to the total area of the surface of the soaking member. Further, the formula (3) expresses tolerance of $S_O/S_T$.

Since the other surface does not contribute to the enhancement of energy efficiency, energy loss increases when the area excessively increases. Accordingly, it is preferable that $S_O/S_T$ is in a range of 0 or more to 0.1 or less. $S_O/S_T$ is preferably 0.05 or less and is more preferably 0.01 or less.

2. Embodiment of Thermoelectric Element 2.1. First Embodiment

FIG. 1A is a perspective view showing a thermoelectric element according to a first embodiment of the present invention and FIG. 1B is a sectional view viewed along a line A-A' in FIG. 1A. In FIGS. 1A and 1B, a thermoelectric element 10a includes a thermoelectric member 12, a pipe 14 and a soaking member 16. In FIGS. 1A and 1B, to make them visible, a part of dimensions of each part are made longer than actual dimensions. In terms of this, FIGS. 2A to 8 described later are also similar.

In this embodiment, the thermoelectric member 12 is cylindrical and has a through hole pierced from one end face to the other end face. The pipe 14 for making fluid (a heat exchange medium such as water) flow is inserted into the through hole. The pipe 14 also functions as one electrode of the thermoelectric member 12 and is thermally and electrically connected to the thermoelectric member 12.

The soaking member 16 is provided to the whole side (the whole surface except the end faces to which the through hole is provided) of the thermoelectric member 12. The soaking member 16 also functions as the other electrode of the thermoelectric member 12 and is thermally and electrically connected to the thermoelectric member 12.

A blackened surface 18 is formed on the light receiving surface side of a surface of the soaking member 16 and a mirror surface 20 is formed on the non-light receiving surface side. In this embodiment, since it is supposed that parallel light irradiates the side of the cylindrical thermoelectric member 12, $S_B/S_T=0.5$.

Further, lead wires 22 for connecting a load (not shown) are respectively bonded to the pipe 14 and the soaking member 16.

When light irradiates the blackened surface 18 of the thermoelectric element 10a configured as described above, the light is absorbed by the blackened surface 18 and is converted to thermal energy. Heat absorbed by the blackened surface 18 is transferred to the soaking member 16. Since materials having high thermal conductivity are used for the soaking member 16, not only the temperature of the light receiving surface side of the soaking member 16 but the temperature of the non-light receiving surface side rise. Therefore, the temperature of the side (the outer peripheral surface) of the thermoelectric member 12 substantially uniformly rises.

When the temperature of the side of the thermoelectric member 12 rises, carriers (holes (h⁺) in the case of p-type thermoelectric materials and electrons (e⁻) in the case of n-type thermoelectric materials) are excited in the vicinity of the side of the thermoelectric member 12. The excited carriers are diffused toward the inner surface side of the thermoelectric member 12. Consequently, when the pipe 14 and the soaking member 16 are connected to a load, electric power can be extracted.

Further, thermal energy which is absorbed by the blackened surface 18 but not converted to electric power is transferred to the pipe 14 via the thermoelectric member 16. Therefore, when a low-temperature heat exchange medium is made to flow in the pipe 14, the heated heat exchange medium can be acquired (that is, exhaust heat from the thermoelectric member 12 can be recovered). For example, when water is used for the heat exchange medium, warm water can be acquired together with electric power.

2.2. Second Embodiment

FIG. 2A is a perspective view showing a thermoelectric element according to a second embodiment of the present invention and FIG. 2B is a sectional view viewed along a line A-A' in FIG. 2A. In FIGS. 2A and 2B, the thermoelectric element 10b includes a thermoelectric member 12, a pipe 14 and a soaking member 16.

In this embodiment, the thermoelectric member 12 is prismatic and is provided with a through hole pierced from one end face to the other end face. The pipe 14 for making fluid (a heat exchange medium such as water) flow is inserted into the through hole.

The soaking ember 16 is provided to the whole side (the whole surface except the end faces to which the through hole is provided) of the thermoelectric member 12. A blackened surface 18 is formed on the light receiving surface side of a surface of the soaking member 16 and a mirror surface 20 is formed on the non-light receiving surface side. In this embodiment, since it is supposed that parallel light irradiates one side of the prismatic thermoelectric member 12, $S_B/S_T$ is 0.25.

Since the other is similar to that of the first embodiment, the description is omitted.

2.3. Third Embodiment

FIG. 3A is a perspective view showing a thermoelectric element according to a third embodiment of the present invention and FIG. 3B is a sectional view viewed along a line B-B' in FIG. 3A. In FIGS. 3A and 3B, the thermoelectric element 10c includes thermoelectric members 12a, 12b, a pipe 14 and soaking members 16a, 16b, 16c.

In this embodiment, the thermoelectric member 12a is made of p-type thermoelectric materials and the thermoelectric member 12b is made of n-type thermoelectric materials. The thermoelectric members 12a, 12b are both cylindrical and are respectively provided with a through hole pierced from one end face to the other end face. The pipe 14 for making fluid (a heat exchange medium such as water) flow is inserted into the through hole.

The pipe 14 is configured by inserting an insulating tube 14c made of insulating materials between two conductive tubes 14a, 14b made of conductive materials. The conductive tubes 14a, 14b also function as an electrode and are electrically and thermally connected to the thermoelectric members 12a, 12b. The insulating tube 14c is arranged between the thermoelectric members 12a, 12b.

Soaking members 16a, 16b are independently provided to respective non-light receiving surfaces of the respective sides of the thermoelectric members 12a, 12b. The vicinity of a light receiving surface of the thermoelectric member 12a and the vicinity of a light receiving surface of the thermoelectric member 12b are coupled via a plate-like soaking member 16c. The soaking member 16c also functions as an electrode that thermally and electrically connects a high-temperature part of the thermoelectric member 12a and a high-temperature part of the thermoelectric member 12b. The thermoelectric members 12a, 12b are connected in series by the soaking member 16c.

A blackened surface 18 is formed on a surface of the soaking member 16c. In contrast, mirror surfaces 20a, 20b are formed on respective surfaces of the soaking members 16a, 16b. In this embodiment, since it is supposed that concentrated light irradiates the respective sides of the cylindrical thermoelectric members 12a, 12b, $S_B/S_T<0.5$.

Further, the lead wires 22 for connecting a load (not shown) are respectively bonded to the conductive tubes 14a, 14b.

When light irradiates the blackened surface 18 of the thermoelectric element 10c configured as described above, the light is absorbed by the blackened surface 18 and is converted to thermal energy. Heat absorbed by the blackened surface 18 is transferred to the respective sides of the thermoelectric members 12a, 12b via the soaking members 16a to 16c. Consequently, the temperature of the respective sides (the outer peripheral surfaces) of the thermoelectric members 12a, 12b substantially uniformly rises.

When the temperature of the side of the thermoelectric member 12a rises, holes ($h^+$) are excited in the vicinity of the side of the thermoelectric member 12a and the excited holes are diffused toward the inner surface side of the thermoelectric member 12a. In contrast, when the temperature of the side of the thermoelectric member 12b rises, electrons ($e^-$) are excited in the vicinity of the side of the thermoelectric member 12b and the excited electrons are diffused toward the inner surface side of the thermoelectric member 12b. Therefore, when the high-temperature parts of the thermoelectric members 12a, 12b are electrically connected in series by the soaking member 16c and the conductive tubes 14a, 14b are respectively connected to a load via lead wire 22, electric power can be extracted.

Further, thermal energy which is absorbed by the blackened surface 18 but not converted to electric power is transferred to the pipe 14 via the thermoelectric members 12a, 12b. Therefore, when a low-temperature heat exchange medium is made to flow in the pipe 14, the heated heat exchange medium can be acquired (that is, exhaust heat from the thermoelectric members 12a, 12b can be recovered).

2.4. Fourth Embodiment

FIG. 4A is a perspective view showing a thermoelectric element according to a fourth embodiment of the present invention and FIG. 4B is a sectional view viewed along a line B-B' in FIG. 4A. In FIGS. 4A and 4B, the thermoelectric element 10d includes thermoelectric members 12a, 12b, a pipe 14 and a soaking member 16.

In this embodiment, the thermoelectric member 12a is made of p-type thermoelectric materials and the thermoelectric member 12b is made of n-type thermoelectric materials. The thermoelectric members 12a, 12b are both cylindrical and are respectively provided with a through hole pierced from one end face to the other end face. The pipe 14 for making fluid (a heat exchange medium such as water) flow is inserted into the through hole. Further, a cylindrical spacer 24 made of insulating materials is inserted between the thermoelectric members 12a, 12b. An outer diameter of the spacer 24 is substantially equalized to outer diameters of the thermoelectric members 12a, 12b and its inner diameter is substantially equalized to an inner diameter of the pipe 14.

The pipe 14 is configured by two conductive tubes 14a, 14b made of conductive materials. The conductive tubes 14a, 14b are separated and are insulated from the other by the spacer 24. The conductive tubes 14a, 14b also function as an electrode and are electrically and thermally connected to the thermoelectric members 12a, 12b.

The soaking member 16 is respectively provided to the side of the respective sides of the thermoelectric members 12a, 12b and the side of the spacer 24. A blackened surface 18 and a mirror surface 20 are formed on a surface of the soaking member 16 so that $S_B/S_T<0.5$. As shown in FIGS. 4A and 4B, when the single soaking member 16 that covers the sides of the thermoelectric members 12a, 12b and the side of the spacer 24 is used, not only the number of parts is reduced, compared with that in FIG. 3 but resistance between the thermoelectric members 12a, 12b can be reduced.

Since the rest is similar to the third embodiment, the description is omitted.

2.5. Fifth Embodiment

FIG. 5A is a perspective view showing a thermoelectric element according to a fifth embodiment of the present invention and FIG. 5B is a sectional view viewed along a line B-B' in FIG. 5A. In FIGS. 5A and 5B, the thermoelectric element 10e includes thermoelectric members 12a to 12d, a pipe 14 and soaking members 16a, 16b.

The thermoelectric element 10e is basically configured by connecting the thermoelectric element 10d shown in FIGS. 4A and 4B by two pieces in series. That is, the thermoelectric members 12a, 12c are made of p-type thermoelectric materials and the thermoelectric members 12b, 12d are made of n-type thermoelectric materials. The thermoelectric members 12a to 12d are all cylindrical and are respectively provided with a through hole pierced from one end face to the other end face. However, to facilitate insulation between high-temperature ends of the thermoelectric members 12a, 12b and high-temperature ends of the thermoelectric members 12c, 12d, an outer diameter of the latter is reduced, compared with that of the former.

The pipe 14 for making fluid (a heat exchange medium such as water) flow is inserted into the through hole. Further, cylindrical spacers 24a, 24b made of insulating materials are inserted between the thermoelectric members 12a, 12b and between the thermoelectric members 12c, 12d.

The pipe 14 is configured by three conductive tubes 14a to 14c made of conductive materials. The conductive tubes 14a to 14c are mutually separated, and the conductive tubes 14a, 14b and the conductive tubes 14b, 14c are insulated by each spacer 24a, 24b.

The soaking member 16a is provided to the side of the thermoelectric members 12a, 12b and the side of the spacer 24a. Similarly, the soaking member 16b is provided to the side of the thermoelectric members 12c, 12d and the side of the spacer 24b. While ends of the soaking members 16a, 16b are out of contact, respective ends are extended so that both ends are mutually overlapped when the ends are viewed from a perpendicular direction to an axial direction of the pipe 14. This reason is to prevent light from directly irradiating the conductive tube 14b.

A blackened surface 18a and a mirror surface 20a are formed on a surface of the soaking member 16a so that $S_B/S_T<0.5$. Similarly, a blackened surface 18b and a mirror surface 20b are formed on a surface of the soaking member 16b so that $S_B/S_T<0.5$.

Since the rest is similar to the third embodiment, the description is omitted.

2.6. Sixth Embodiment

FIGS. 6A and 6B are perspective views showing thermoelectric elements according to a sixth embodiment of the present invention. In FIG. 6A, the thermoelectric element 10f is configured by arranging the thermoelectric element 10e shown in FIGS. 5A and 5B laterally in a row and electrically connecting each thermoelectric element 10e in series. The arrangement of an n-type thermoelectric member and a p-type thermoelectric member of the thermoelectric element 10e located in the center is made inverse to the arrangement of each n-type thermoelectric member and each p-type thermoelectric member of the thermoelectric elements 10e at both ends. In this case, soaking members of the adjacent thermoelectric elements 10e are required to be mutually insulated. That is, the adjacent thermoelectric elements 10e are required to be separated or insulating materials are required to be filled in clearance between the adjacent thermoelectric elements 10e.

In FIG. 6B, the thermoelectric element 10g is configured by arranging the thermoelectric element 10e shown in FIGS. 5A and 5B laterally in a row and electrically connecting each thermoelectric element 10e in parallel. The arrangement of an n-type thermoelectric member and a p-type thermoelectric member of each thermoelectric element 10e is the same. In this case, soaking members of the adjacent thermoelectric elements 10e are not necessarily required to be mutually insulated.

As shown in FIGS. 6A and 6B, when the thermoelectric elements 10e are arranged laterally in a row, the total area of blackened surfaces 18 can be increased. In this case, as shown in FIGS. 6A and 6B, each thermoelectric element 10e may also be arranged so that larger-diameter parts are adjacent. Or though the following is not shown, each thermoelectric element 10e may also be arranged so that its larger-diameter part and its smaller-diameter part are alternately arrayed in a hound's-tooth check pattern. In the case of the latter, light that passes clearance between each thermoelectric element 10e can be reduced. The thermoelectric elements 10f, 10g configured as described above are effective in a case where radiant heat is converted to electric power for example.

Since the rest is similar to the third embodiment, the description is omitted.

2.7. Seventh Embodiment

FIG. 7A is a perspective view showing a thermoelectric element according to a seventh embodiment of the present invention and FIG. 7B is a sectional view viewed along a line B-B' in FIG. 7A. In FIGS. 7A and 7B, the thermoelectric element 10h includes a thermoelectric member 12, a pipe 14, a soaking member 16 and a chemical heat storage material 26.

In this embodiment, the chemical heat storage material 26 is filled in the pipe 14. The seventh embodiment is different from the first embodiment in this aspect. As for the rest, since the seventh embodiment is similar to the first embodiment, the description is omitted.

When light irradiates the blackened surface 18 of the thermoelectric element 10h configured as described above, thermal energy unconverted to electric power is emitted from the inner surface side of the thermoelectric member 12 and the chemical heat storage material 26 is heated by this heat. Consequently, a working medium (for example, steam) is desorbed from the chemical heat storage material 26. In contrast, when a working medium is supplied to the pipe 14 in a state in which light does not irradiate the blackened surface 18 (for example, at night or cloudy weather), the working medium is bound to the chemical heat storage material 26 and heat is released. This heat can be extracted from the thermoelectric member 12 as electric power.

3. Thermoelectric Generation System

FIG. 8 is a schematic diagram showing a thermoelectric generation system according to one embodiment of the present invention. In FIG. 8, the thermoelectric generation system 30 is configured as follows.

(1) The thermoelectric generation system 30 includes:
a container 40 having a lighting window 42 for taking light inside,
the thermoelectric element 10 housed in the container 40 according to the present invention,
a fluid feeder (not shown) for feeding fluid to the pipe 14, and
a power consumption source (not shown) that consumes electric power generated by the thermoelectric element 10.

(2) The thermoelectric element 10 is housed in the container 40 so that the blackened surface 18 is located under the lighting window 42.

The thermoelectric generation system 30 may further include:

(a) a light concentrating device 44 for concentrating light and transmitting the concentrated light toward the lighting window 42 and/or (b) a tracking device (not shown) for directing the light receiving surface of the thermoelectric element 10 toward a light source.

3.1. Container

The container 40 is provided to house the thermoelectric element 10. Both ends of the pipe 14 of the thermoelectric element 10 are extended outside the container 40. The lighting window 42 for taking light inside from the outside is provided to the container 40. The thermoelectric element 10 is housed in the container 40 so that the blackened surface 18 is located under the lighting window 42.

The air may also exist in the container 40. However, when the air exists in the container 40, heat loss due to convection from the high-temperature part of the thermoelectric element 10 increases. Therefore, to acquire high thermal efficiency, it is preferable that the container 40 is a vacuum container. The vacuum container may also be sealed or it may also be provided with a vacuum pump for exhausting the inside of the container 40.

3.2. Thermoelectric Element

[3.2.1. Configuration of Thermoelectric Element]
The thermoelectric element 10 is housed in the container 40. One thermoelectric element 10 may also be housed in the container 40 or two or more thermoelectric elements may also be housed. As the details of the thermoelectric elements 10 (10a to 10h) are described above, the description is omitted.

[3.2.2. Blackening Process Ratio, Light Receiving Surface Ratio]
It is preferable that the thermoelectric element 10 meets relation of the following formulas (1) to (5).

$$S_T = S_B + S_M + S_O \tag{1}$$

$$0 < S_B/S_T \leq 0.6 \tag{2}$$

$$0 < S_O/S_T \leq 0.1 \tag{3}$$

$$0 < S_L/S_T \leq 0.5 \tag{4}$$

$$S_L/S_T \leq S_B/S_T \leq S_L/S_T + 0.1 \tag{5}$$

where
$S_T$ denotes the total area of the surface of the soaking member,
$S_B$ denotes the area of the blackened surface,
$S_M$ denotes the area of the mirror surface,
$S_O$ denotes the area of a surface except the blackened surface and the mirror surface within the surface of the soaking member, and $S_L$ denotes the area of the light receiving surface of the thermoelectric element.

Since the formulas (1) to (3) among these formulas are described above, their description is omitted.

"$S_L/S_T$" in the formula (4) denotes a rate (light receiving surface ratio) of the area of the light receiving surface to the total area of the surface of the soaking member 16. Further, the formula (4) expresses tolerance of $S_L/S_T$.

As described above, when light is concentrated, $S_L/S_T$ can be minimized. In contrast, when the coverage factor is 100% and parallel rays irradiate the soaking member 16, $S_L/S_T$ is 0.5 at most. Therefore, $S_L/S_T$ can be arbitrarily selected in a range of more than 0 to 0.5 or less.

The formula (5) expresses tolerance of $S_B/S_T$. When the blackening process ratio ($S_B/S_T$) is smaller than the light receiving surface ratio ($S_L/S_T$), a part of light is reflected by the mirror surface. Accordingly, it is preferable that $S_L/S_T \leq S_B/S_T$.

In contrast, when the blackening process ratio is excessively larger, compared with the light receiving surface ratio, radiation loss from the blackened surface increases. Accordingly, it is preferable that $S_B/S_T \leq S_L/S_T + 0.1$.

3.3. Fluid Feeder

The fluid feeder for feeding fluid is connected to the pipe 14. The fluid feeder is not especially limited and optimum one can be selected according to a type of fluid.

For example, when the thermoelectric generation system 30 according to the present invention is applied to a hot-water supply system, the pipe 14 is connected to a feed water tank and a feed water pump. When the feed water pump is operated and electric power is generated in the thermoelectric element 10 while supplying cool water into the pipe 14, warm water can be extracted from the pipe 14.

Or when the pipe 14 is filled with the chemical heat storage material and a working medium is water (steam), the pipe 14 is connected to a steam generator and a water tank.

3.4. Power Consumption Source

Power consumption sources that consume electric power generated by the thermoelectric element 10 are connected to the thermoelectric element 10 via the lead wires 22. The power consumption source is not especially limited and optimum one can be selected according to an object.

Examples of the power consumption source include the followings:

(a) a feed water pump for feeding water to the pipe 14;

(b) a tracking device for directing the light receiving surface of the thermoelectric element 10 toward a light source;

(c) a battery for storing electric power; and (d) office automation equipment, lighting fittings, air conditioning equipment, household electrical appliances or factory facilities.

3.5. Light Concentrating Device

The light concentrating device 44 concentrates light (for example, solar ray) and transmits the concentrated light toward the lighting window 42. For the light concentrating device 44, for example, Fresnel lens, a converging mirror and a convex lens can be given. The light concentrating device 44 is not necessarily required. However, when the light concentrating device 44 is used, great temperature difference can be generated by the thermoelectric element 10.

3.6. Tracking Device

The tracking device is provided to direct the light receiving surface of the thermoelectric element 10 toward a light source. To acquire high thermal efficiency, it is preferable that light is made incident perpendicularly to the light receiving surface. For example, when a light source is fixed as in a case where radiant heat (far infrared ray) from a high-temperature furnace irradiates the light receiving surface, no tracking device is required. In contrast, when an incident direction of light momently changes like solar ray, it is preferable that the light receiving surface is directed in a direction of the sun using the tracking device.

4. Effect

The soaking member is provided to the side of the thermoelectric member in the thermoelectric element according to the present invention. Further, a blackening process is applied to the light receiving surface within the surface of the soaking member and a mirror finish process is applied to the non-light receiving surface. When light such as solar ray and far infrared ray irradiates the blackened surface of the thermoelectric element, the light is absorbed by the blackened surface and is converted to thermal energy. Since this thermal energy is transferred to the thermoelectric member via the soaking member, the light receiving surface is not locally heated and the whole side of the thermoelectric member is substantially uniformly heated. Consequently, relatively great temperature difference (that is, electromotive force) is generated between the side of the thermoelectric member and the inner surface of the through hole.

Further, while the blackened surface has high absorption efficiency of light energy, heat loss by radiation is great. In contrast, while the mirror surface has low absorption efficiency of light energy, heat loss by radiation is small. Therefore, when the blackened surface is formed on the light receiving surface and the mirror surface is formed in the remaining part on the surface of the soaking member, heat loss by radiation can be restricted to the minimum and heat can be made to efficiently flow in the thermoelectric member.

Further, when fluid is made to flow in the pipe inserted into the thermoelectric member, heat transmitted through the thermoelectric member without being converted to electric power can be recovered and utilized. That is, in the present invention, since light energy is utilized for electrical energy and thermal energy, utilization efficiency of energy is high. Therefore, according to the present invention, a thermoelectric generation-heat utilization hybrid system having high energy utilization efficiency utilizing solar ray, exhaust heat of a factory and the like can be realized.

EXAMPLES

[1. Production of Thermoelectric Generation System]
[1.1. Model 1]

A thermoelectric generation system 30 shown in FIG. 8 is produced. The inside of a container 40 is kept at a degree equal to or below 10 Pa of a vacuum using a rotary pump. For a thermoelectric member 12, a cylindrical member (outer diameter: 12 mm, inner diameter: 3 mm, length: 7.5 mm) made of $CoSb_3$ based thermoelectric materials is used.

For a soaking member 16, an iron-nickel alloy is used, a blackening process and a mirror finish process are applied to a light receiving surface and a non-light receiving surface. For the blackening process, blackening paint (JSC No. 3) manufactured by Japan Sensor Co., Ltd. is used. For the mirror finish process, Ag plate is used. Further, $S_B/S_T=0.5$.

[1.2. Model 2]

A thermoelectric generation system is produced in a similar manner to the model 1 except that a blackening process is applied to the whole surface of a soaking member 16.

[2. Test Method and Result]

[2.1. Dependency upon Incident Light Energy]

The light receiving surface is irradiated by solar ray and temperature $T_{max}$ of a high-temperature part is measured. Concentration ratio is 400 to 1600 times. FIG. 9 shows relation between incident energy and temperature (outer peripheral temperature) $T_{max}$ of a high-temperature part of a thermoelectric element 10. Experimental values satisfactorily accord with a result of simulation. This means that among heat of the high-temperature part to which a blackening process is applied of the thermoelectric element 10, heat except heat loss by radiation flows to the thermoelectric member 12.

FIG. 10 shows radiation loss to incident energy, the temperature $T_{max}$ of the high-temperature part, and a radiation loss rate (where $T_c=353$ K). It can be found from FIG. 10 that when a blackening process is applied to a half of the surface of the soaking member 16 and a mirror finish process is applied to the remaining half, heat loss by radiation can be reduced to a half extent, compared with a case where a blackening process is applied to the whole surface of the soaking member 16. That is, if incident energy is the same, the temperature $T_{max}$ of the high-temperature part rises and more electric power can be acquired by the quantity.

[2.2. Reflectance]

FIG. 11 shows dependency upon a wavelength of reflectance of each surface. Mean reflectance of light having a wavelength of 500 to 1800 nm is turned 5% by using the blackening paint manufactured by Japan Sensor (JSC No. 3) and solar ray can be substantially absorbed. In contrast, mean reflectance of light having a wavelength of 500 to 1800 nm exceeds 90% by plating a surface of the iron-nickel alloy with Ag and there is substantially no radiation. Accordingly, energy loss can be restricted to the minimum by applying the blackening process and the mirror finish process to the surface of the soaking member 16.

[2.3. Hot-Water Supply Test]

The light receiving surface of the thermoelectric element 10 is irradiated by solar ray, making water having temperature of approximately 30° C. flow in the pipe 14 and power generation is performed. Consequently, warm water having temperature of 50 to 80° C. is acquired from an outlet of the pipe 14.

[2.4. Dependency upon Blackening Process Ratio of Radiation Loss Rate]

Dependency upon blackening process ratio $S_B/S_T$ of the radiation loss rate $Q_R/Q_{in}$ (where $T_c=353$ K) is calculated using the model. In the calculation, it is supposed that light irradiates the whole upper half of the surface of the soaking member. FIG. 12 shows the result.

When $S_B/S_T=0.5$ and $S_M/S_T=0.5$, the area $S_L$ ($<S_T$) of the light receiving surface is equal to the area $S_B$ of the blackened surface and a surface except the light receiving surface is all the mirror surface $S_M$.

At the time of $S_B/S_T<1$, radiation loss reduction effect emerges and as $S_B/S_T$ approached 0.5, the radiation loss rate decreased. That is, it can be found that under any shape and any light concentrating condition, energy utilization efficiency is maximum by equalizing the area $S_L$ of the light receiving surface to the area $S_B$ of the blackened surface and making the remaining surface the mirror surface $S_M$. Since $S_L/S_T$ 0.5 in a normal case including the case of light concentration, $S_B/S_T \leq 0.5$ ideally to reduce a radiation loss rate. However, a light concentrating surface may be displaced by a subtle turn of the element and the like, or light may also irradiate a lower half of the thermoelectric element 10 depending upon a light concentrating condition. Considering these, it is practically preferable that $S_B/S_T \leq 0.6$.

Further, for example, when solar ray is concentrated and is used while tracking the sun, a position of the light receiving surface is moved in a certain range due to the occurrence of chromatic aberration or a motion of a motor during tracking. Therefore, it is practical that the area $S_B$ of the blackened surface is set to be a little larger than the area $S_L$ of the light receiving surface. Accordingly, it is preferable that $S_L/S_B \leq S_B/S_T \leq S_L/S_T+0.1$. In FIG. 12, as $S_L/S_T=0.5$, the increase of $Q_R$ can be restricted to 1.2 times of $S_B/S_T=S_L/S_T$ ($S_B/S_T=0.5$) even if $S_B/S_T=S_L/S_T+0.1$ ($S_B/S_T=0.6$).

Actually, in this verification, it is confirmed that when light is concentrated to a square approximately 5 mm, the position of the light receiving surface is moved by approximately 1 mm by chromatic aberration of approximately 1 mm and a motion of the motor of the tracking device.

In the high-temperature part of the thermoelectric member 12, the surface $S_O$ except the mirror surface and the blackened surface may be made because of electrode junction and the like. To acquire high efficiency, it is preferable that $S_O$ is kept in a required minimum range ($0 \leq S_O/S_T \leq 0.1$).

The "light receiving surface" is defined as a surface on which light energy of 0.01 W/cm² or more is incident. This value is a value on a condition that electric power of 1 kW is acquired in the area of 10×10 m² when a thermoelectric element having thermoelectric conversion efficiency of 10% is used and a profit is not acquired at or below this value. Incidentally, solar ray is approximately 0.1 W/cm².

[2.5. Dependency Upon Thermal Conductivity of Radiation Loss Rate]

Dependency upon thermal conductivity of the thermoelectric member 12 of a radiation loss rate $Q_R/Q_{in}$ (where $T_c=353$ K) is calculated using the model. In the calculation, it is supposed that light irradiates the whole upper half of the soaking member. Table 1 shows its result.

TABLE 1

Model computational contents
$S_O/S_T = 0$, $S_B/S_T = 0.5$, $S_M/S_T = 0.5$
Model1: κ = 1.89 W/mK
Model3: κ = 1 W/mK
Model4: κ = 5 W/mK

| Model | Incident energy $Q_{in}$(W) | Radiation loss $Q_R$(W) | Outer peripheral temperature $T_{max}$(K) | Radiation loss rate $Q_R/Q_{in}$(%) |
|---|---|---|---|---|
| 1 | 8.6 | 0.4 | 480 | 4.7 |
| 1 | 34.1 | 3.7 | 826 | 10.9 |
| 1 | 80.1 | 21.0 | 1273 | 26.2 |
| 3 | 4.7 | 0.4 | 480 | 8.5 |
| 3 | 19.8 | 3.7 | 826 | 18.7 |
| 3 | 52.3 | 21.0 | 1273 | 40.1 |
| 4 | 22.0 | 0.4 | 480 | 1.8 |
| 4 | 84.1 | 3.7 | 826 | 4.4 |
| 4 | 177.4 | 21.0 | 1273 | 11.8 |

Even if thermal conductivity κ of the thermoelectric member 12 is varied, $Q_R$ (of the models 1, 3, 4) at the time of $S_B/S_T=0.5$ and $S_M/S_T=0.5$ is equal to or below ½ (of the model 2) at the time of $S_B/S_T=1.0$ and $S_M/S_T=0$ and radiation loss can be reduced. Accordingly, if the temperature $T_{max}$ of the high-temperature part is the same, radiation loss can be reduced when the thermal conductivity κ of the thermoelectric member 12 is high (that is, when quantity of heat $(Q_{in}-Q_R)$ flowing in the thermoelectric element is much).

The embodiments of the present invention have been described in detail, however, the present invention is not limited to the abovementioned embodiments, and various variations are allowed in a range that does not deviate from a subject matter of the present invention.

The thermoelectric element and the thermoelectric generation system according to the present invention can be applied to a power generation/hot-water supply system utilizing solar ray and exhaust heat of a factory and the like.

What is claimed is:

1. A thermoelectric element, comprising:
a thermoelectric member made of thermoelectric materials and having a through hole pierced from one end face to another end face;
a pipe inserted into the through hole, the pipe being configured to flow fluid within an interior of the pipe, the pipe functioning as one electrode of the thermoelectric member; and
a soaking member provided to a side of the thermoelectric member, the soaking member functioning as another electrode of the thermoelectric member, wherein:
a surface of the soaking member includes a blackened surface portion to which a blackening process is applied and a mirror surface portion to which a mirror finish process is applied, and
the thermoelectric element meets the following formulas (1) to (3):

$$S_T=S_B+S_M+S_O \quad (1)$$

$$0<S_B/S_T<0.6 \quad (2)$$

$$S_O/S_T=0 \quad (3)$$

where:
$S_T$ denotes the total area of the surface of the soaking member,
$S_B$ denotes the area of the blackened surface portion,
$S_M$ denotes the area of the mirror surface portion, and
$S_O$ denotes the area of a surface portion except the blackened surface portion and the mirror surface portion within the surface of the soaking member.

2. The thermoelectric element according to claim 1, wherein
the thermoelectric member includes one or more p-type thermoelectric members made of p-type thermoelectric materials and one or more n-type thermoelectric members made of n-type thermoelectric materials;
the one or more p-type thermoelectric members and the one or more n-type thermoelectric members are alternately mounted on the pipe; and
the one or more p-type thermoelectric members and the one or more n-type thermoelectric members are electrically connected in series.

3. The thermoelectric element according to claim 1, wherein the thermoelectric member is a cylinder with the through hole formed in the center.

4. The thermoelectric element according to claim 1, wherein the pipe is filled with a chemical heat storage material.

5. A thermoelectric generation system, comprising:
a container having a lighting window for taking light inside;
the thermoelectric element according to claim 1 housed in the container;
a fluid feeder for feeding fluid into the pipe; and
a power consumption source that consumes electric power generated by the thermoelectric element, wherein
the thermoelectric element is housed in the container so that the blackened surface portion is located under the lighting window.

6. The thermoelectric generation system according to claim 5 in which the thermoelectric element meets relation of the following formulas (1) to (5), wherein $$S_T=S_B+S_M+S_O \quad (1)$$

$$0<S_B/S_T\leq0.6 \quad (2)$$

$$S_O/S_T=0 \quad (3)$$

$$0<S_L/S_T\leq0.5 \quad (4)$$

$$S_L/S_T\leq S_B/S_T\leq S_L/S_T+0.1 \quad (5)$$

where:
$S_T$ denotes the total area of the surface of the soaking member,
$S_B$ denotes the area of the blackened surface portion,
$S_M$ denotes the area of the mirror surface portion,
$S_O$ denotes the area of the surface portion except the blackened surface portion and the mirror surface portion within the surface of the soaking member, and
$S_L$ denotes the area of a light receiving surface of the thermoelectric element.

7. The thermoelectric generation system according to claim 5, further comprising:
a light concentrating device configured to concentrate light and transmit the concentrated light toward the lighting window.

8. The thermoelectric generation system according to claim 5, further comprising:
a tracking device configured to direct a light receiving surface of the thermoelectric element to a light source.

9. The thermoelectric generation system according to claim 5, wherein the container is a vacuum container.

* * * * *